(12) United States Patent
Miyahara et al.

(10) Patent No.: US 12,432,989 B2
(45) Date of Patent: Sep. 30, 2025

(54) SEMICONDUCTOR DEVICE AND METHOD FOR MANUFACTURING THE SAME

(71) Applicant: DENSO CORPORATION, Kariya (JP)

(72) Inventors: Shinichiro Miyahara, Kariya (JP); Shunsuke Harada, Kariya (JP); Tomoo Morino, Kariya (JP)

(73) Assignee: DENSO CORPORATION, Kariya (JP)

( * ) Notice: Subject to any disclaimer, the term of this patent is extended or adjusted under 35 U.S.C. 154(b) by 430 days.

(21) Appl. No.: 18/060,191

(22) Filed: Nov. 30, 2022

(65) Prior Publication Data

US 2023/0197774 A1    Jun. 22, 2023

(30) Foreign Application Priority Data

Dec. 16, 2021 (JP) ................. 2021-204354

(51) Int. Cl.
| | |
|---|---|
| *H10D 62/10* | (2025.01) |
| *H01L 21/04* | (2006.01) |
| *H10D 12/01* | (2025.01) |
| *H10D 30/66* | (2025.01) |
| *H10D 62/17* | (2025.01) |
| *H10D 62/832* | (2025.01) |

(52) U.S. Cl.
CPC ....... *H10D 62/109* (2025.01); *H01L 21/0465* (2013.01); *H01L 21/049* (2013.01); *H10D 12/031* (2025.01); *H10D 30/665* (2025.01); *H10D 30/668* (2025.01); *H10D 62/107* (2025.01); *H10D 62/393* (2025.01); *H10D 62/8325* (2025.01)

(58) Field of Classification Search
None
See application file for complete search history.

(56) References Cited

U.S. PATENT DOCUMENTS

| | | |
|---|---|---|
| 2017/0263757 A1 | 9/2017 | Saikaku et al. |
| 2019/0172944 A1 | 6/2019 | Okumura |
| 2019/0288107 A1 | 9/2019 | Saikaku et al. |
| 2021/0013339 A1 | 1/2021 | Okumura |
| 2021/0043723 A1 | 2/2021 | Kyogoku et al. |
| 2024/0250167 A1 | 7/2024 | Okumura |
| 2024/0258425 A1* | 8/2024 | Takaya ................. H10D 30/668 |

FOREIGN PATENT DOCUMENTS

JP    5758824 B2    8/2015

\* cited by examiner

*Primary Examiner* — Jack S Chen
(74) *Attorney, Agent, or Firm* — Posz Law Group, PLC

(57) ABSTRACT

A semiconductor device includes a vertical semiconductor element having a deep layer, a current dispersion layer, a base region, a high-concentration region, and a trench gate structure. The deep layer has multiple sections being apart to each other in one direction. The current dispersion layer is between adjacent two of the sections of the deep layer. The high-concentration region is on a portion of the base region. The trench gate structure includes a gate trench, a gate insulation film and a gate electrode. The current dispersion layer is at a bottom of the trench gate structure, and has an ion-implanted layer extending from a bottom portion of the gate trench to a bottom portion of the deep layer or a location below the bottom portion of the deep layer.

7 Claims, 11 Drawing Sheets

SEMICONDUCTOR DEVICE AND METHOD FOR MANUFACTURING THE SAME

CROSS REFERENCE TO RELATED APPLICATION

This application is based on Japanese Patent Application No. 2021-204354 filed on Dec. 16, 2021, the disclosure of which is incorporated herein by reference.

TECHNICAL FIELD

The present disclosure relates to a semiconductor device having a vertical semiconductor element with a trench gate structure, and relates to a method for manufacturing the semiconductor device.

BACKGROUND

A semiconductor device may include a vertical metal-oxide-semiconductor field-effect transistor (MOSFET) having a trench gate structure. In the semiconductor device, multiple trench gate structures having a lengthwise direction in one direction may be formed at a surface layer portion of a drift layer on a substrate.

SUMMARY

The present disclosure describes a semiconductor device including a vertical semiconductor element with a trench gate structure and a current dispersion layer, and further describes a method of manufacturing the semiconductor device including formation of the trench gate structure and formation of the current dispersion layer.

BRIEF DESCRIPTION OF DRAWINGS

The above objects, features and advantages of the present disclosure will become more apparent from the following detailed description made with reference to the accompanying drawings. In the drawings.

DETAILED DESCRIPTION

Figure 1:
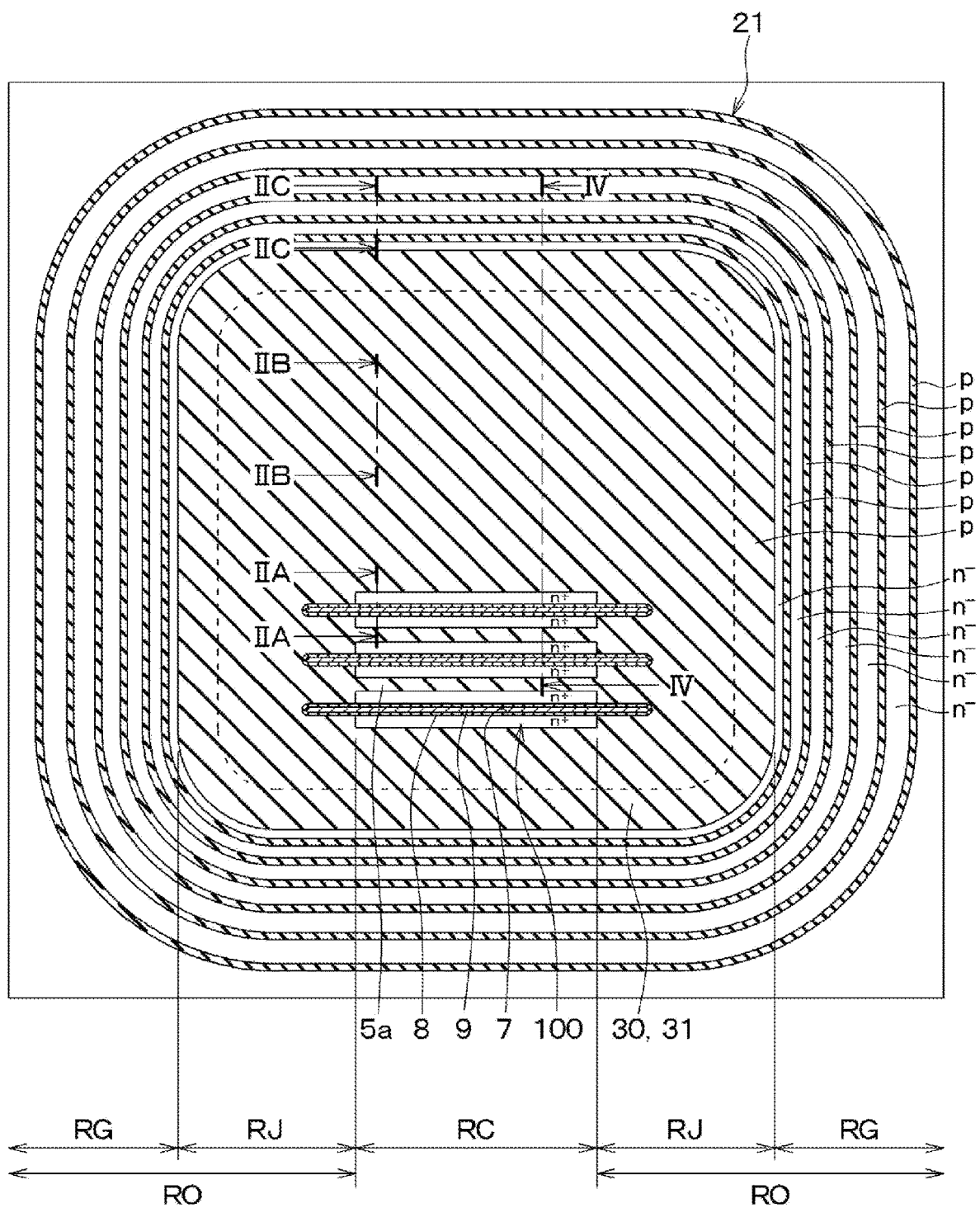
FIG. 1 is a top layout diagram showing a SiC semiconductor device according to a first embodiment.

In a semiconductor device having a vertical MOSFET as a comparative example, multiple trench gate structures having a lengthwise direction in one direction are formed at a surface layer portion of the $n^-$-type drift layer on an $n^+$-type substrate, and a p-type body region and an $n^+$-type source region are formed between the trench gate structures. The $n^+$-type source region extends in the lengthwise direction of the trench gate structure at both sides of the trench gate structure in a width direction of the trench gate structure. A p-type contact region having high concentration is formed at a central position of the p-type base region, in other words, a portion of the p-type base region between adjacent sections of the $n^+$-type source region.

In the semiconductor device with such a structure, a gate insulation film may have a dielectric breakdown when electrical field concentration occurs at a bottom portion of the trench gate structure. Therefore, at a position corresponding to the p-type contact region, a p-type deep layer is arranged at a position deeper than the p-type base region.

With the formation of the p-type deep layer, the electrical field applied to the bottom portion of the trench gate structure is suppressed, and the dielectric breakdown of the gate insulation film is suppressed.

In the structure with the p-type deep layers, the p-type deep layers are arranged with a predetermined spacing between the adjacent p-type deep layers while an n-type current dispersion layer is formed between the adjacent p-type deep layers; and the trench gate structure is formed at a position corresponding to the n-type current dispersion layer. Subsequent to the formation of the p-type deep layers through, for example, ion implantation, the p-type base region and the $n^+$-type region are formed, and a gate trench is further formed by trench etching. The gate insulation film and the gate electrode are formed in a trench gate to form the trench gate structure.

However, in the comparative example as described above, positional misalignment may occur between the p-type deep layer and the trench gate structure that may cause characteristic fluctuation in the MOSFET, and separate manufacturing processes may be required. Thus, the manufacturing process may take longer and the manufacturing cost may increase.

According to a first aspect of the present disclosure, a semiconductor device includes a vertical semiconductor element located in a cell region of the semiconductor device. The vertical semiconductor element includes a first semiconductor layer, a second semiconductor layer, a deep layer, a current dispersion layer, a base region, a high-concentration region, a trench gate structure, an interlayer insulation film, a first electrode, and a second electrode. The first semiconductor layer is a first conductivity type or a second conductivity type. The second semiconductor layer is the first conductivity type and is located on the first semiconductor layer. The deep layer is the second conductivity type, and is located on the second semiconductor layer. The deep layer has multiple sections being apart to each other in one direction in the cell region. The current dispersion layer is the first conductivity type, and is located between adjacent two of the sections of the deep layer on the semiconductor layer in the cell region. The base region is the second conductivity type. The base region has a contact region having higher impurity concentration than another region of the base region. The contact region is located in at least a surface portion of the base region. The high-concentration region is the first conductivity type, and is located on a portion of the base region different from the contact region. The high-concentration region has higher impurity concentration than the second semiconductor layer. The trench gate structure includes a gate trench, a gate insulation film and a gate electrode. The gate trench is extended from a surface of the high-concentration region and reaches the base region. The gate insulation film covers an inner wall surface of the gate trench. The gate electrode is located on the gate insulation film. The interlayer insulation film covers the gate electrode and the gate insulation film, and has a contact hole. The first electrode is electrically connected to the high-concentration region and the contact region through the contact hole. The second electrode is located at a side of the first semiconductor layer opposite from the second semiconductor layer. The current dispersion layer is located below the trench gate structure, and includes an ion-implanted layer extending from a bottom portion of the gate trench to a bottom portion of the deep layer or a location below the bottom portion of the deep layer.

The current dispersion layer is arranged below the trench gate structure, and includes the ion-implanted layer having a thickness from the bottom portion of the gate trench to the bottom portion of the deep layer or a position below the bottom portion of the deep layer. In such a structure, no positional misalignment occurs between the trench gate structure and the deep layer. The respective paths of the current flowing along the side surfaces of each of the current dispersion layer and the gate trench are the same on the left and right sides of the trench gate structure. Therefore, it is possible to suppress the characteristic fluctuation.

According to a second aspect of the present disclosure, a method of manufacturing includes preparation of a first semiconductor layer and a second semiconductor layer, formation of a first layer and a second layer, formation of a first-conductivity-type layer, formation of a second-conductivity-type layer, arrangement of a mask, formation of a gate trench, formation of a current dispersion layer, formation of a trench gate structure, formation of an interlayer insulation film, formation of a first electrode, and formation of a second electrode. The first semiconductor layer is a first conductivity type or a second conductivity type, and the second semiconductor layer is the second conductivity type and is formed on the first semiconductor layer. The first layer is formed on the second semiconductor layer in a cell region of the semiconductor device at which a vertical semiconductor element having a trench gate structure is formed. The second layer is formed on the first layer in the cell region. Each of the first layer and the second layer is the second conductivity type. The first-conductivity-type layer is formed on the second layer. The first-conductivity-type layer is the first conductivity type, and has higher impurity concentration than the second semiconductor layer. The second-conductivity-type layer is formed by conducting ion implantation of second-conductivity-type impurities to the first-conductivity-type layer. The second-conductivity-type layer is connected to the second layer, and has higher impurity concentration than the second layer. The second-conductivity-type impurities are the second conductivity type, the second-conductivity-type layer is the second conductivity type. The mask is arranged on the first-conductivity-type layer, the second-conductivity-type layer and the second semiconductor layer. The mask has an opening at a portion corresponding to a formation prospective region of the trench gate structure at which the trench gate structure is to be formed. The gate trench is formed by forming a high-concentration region, a base region and a contact region through etching with the mask. The gate trench penetrates the first-conductivity-type layer and reaches the second layer. The high-concentration region is formed by the first-conductivity-type layer located at a side surface of the gate trench. The base region is formed by the second layer. The contact region is formed by the second-conductivity-type layer at a part in a surface portion of the base region. The contact region has higher impurity concentration than another region of the base region different from the contact region. The current dispersion layer is formed by conducting ion implantation of first-conductivity-type impurities with the mask to form an ion-implanted layer from a bottom portion of the gate trench to a bottom portion of a deep layer or a location below the bottom portion of the deep layer. The first-conductivity-type impurities are the first conductivity type, and the current dispersion layer is the first conductivity type. The trench gate structure is formed by forming a gate insulation film in the gate trench and arranging the gate electrode on the gate insulation film. The gate insulation film covers an inner wall surface of the gate trench. The interlayer insulation film is formed to cover the gate electrode and the gate insulation film. The interlayer insulation film has a contact hole. The first electrode is formed to be electrically connected to the high-concentration region and the contact region through the contact hole. The second electrode is formed at the first semiconductor layer on a side opposite from the second semiconductor layer.

The current dispersion layer is formed by ion implantation of the first conductivity-type impurities by again adopting the mask used at the formation of the gate trench to form the trench gate structure. As a result, since the current dispersion layer can be formed in a self-aligned manner with respect to the trench gate structure, it is possible to eliminate the positional misalignment between the deep layer and the trench gate structure, and it is possible to suppress the characteristic fluctuation. Since the mask at the formation of the gate trench is the same mask adopted for forming the current dispersion layer, it is possible to simplify the manufacturing process, and it is possible to reduce the manufacturing cost.

The following describes several embodiments of the present disclosure with reference to the drawings. In the following embodiments, the same or equivalent parts are denoted by the same reference numerals.

(First Embodiment) The following describes a first embodiment. Here, a SiC semiconductor device in which an inverted vertical MOSFET having a trench gate structure is formed as a semiconductor element will be described as an example.

The SiC semiconductor device shown in FIG. 1 has a structure having a cell region RC and an outer peripheral region RO. In the cell region RC, a MOSFET 100 with a trench gate structure is formed. The outer peripheral region RO surrounds the cell region RC. The outer peripheral region RO has a guard ring region RG and a junction region RJ disposed inside the guard ring region RG. In other words, the junction region RJ is between the cell region RC and the guard ring region RG. It should be noted that FIG. 1 is not a cross-sectional view, but is partially hatched for clarity. The MOSFET 100 corresponds to a vertical semiconductor element.

Figure 2A:
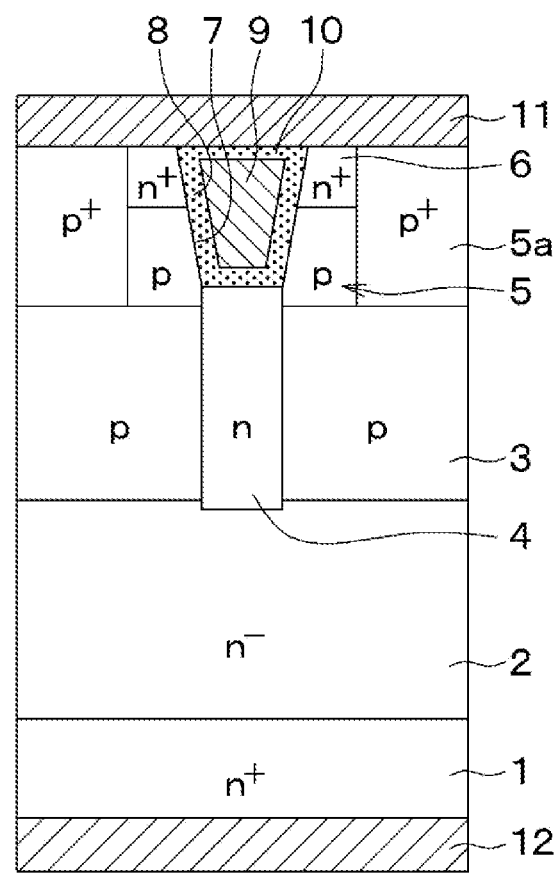
FIG. 2A is a cross-sectional view taken along a line IIA-IIA of FIG. 1.
Figure 2B:
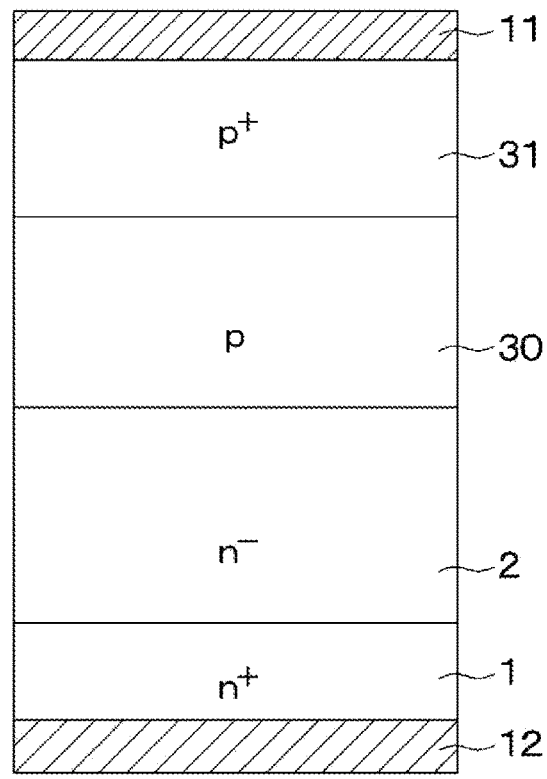
FIG. 2B is a cross-sectional view taken along a line IIB-IIB of FIG. 1.
Figure 2C:
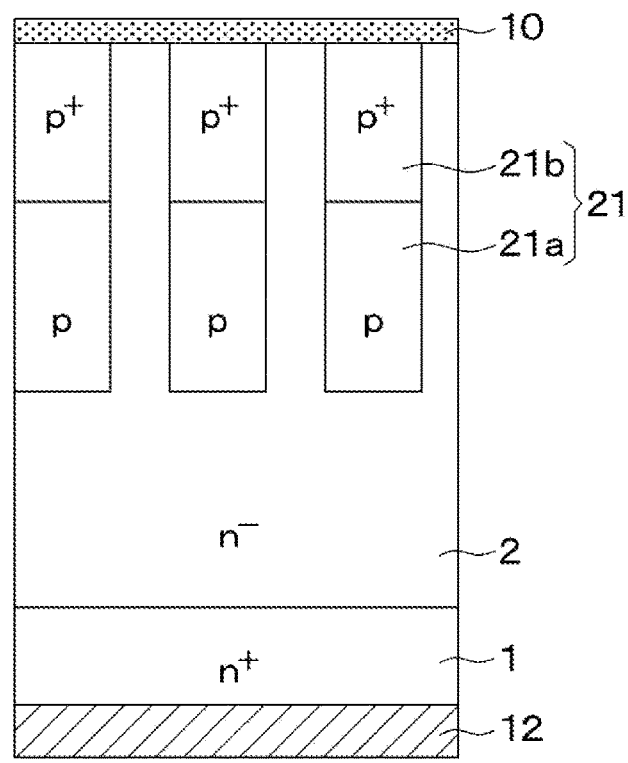
FIG. 2C is a cross-sectional view taken along a line IIC-IIC of FIG. 1.

As shown in FIGS. 2A to 2C, the SiC semiconductor device is formed of an $n^+$-type substrate 1 made of SiC. An $n^-$-type layer 2 made of SiC is formed on a main surface of the $n^+$-type substrate 1. The $n^+$-type substrate 1 corresponds to a first semiconductor layer, and the $n^-$-type layer 2 corresponds to a second semiconductor layer.

The $n^+$-type substrate 1 is an offset substrate that has, for example, an n-type impurity concentration of $1.0 \times 10^{19}/cm^3$, a surface of (0001) Si plane, and an offset direction of <11-20>. The $n^-$-type layer 2 has lower impurity concentration than the $n^+$-type substrate 1, for example, n-type impurity concentration of $0.5 \times 10^{15}$ to $2.0 \times 10^{16}/cm^3$.

In the cell region RC, a p-type deep layer 3 and an n-type current dispersion layer 4 are arranged on the $n^-$-type layer 2. A p-type base region 5 is formed on the p-type deep layer 3, and an $n^+$-type source region 6 corresponding to a high-concentration region is formed at a surface layer portion of the p-type base region 5. The trench gate structure is arranged on the n-type current dispersion layer 4.

The p-type deep layer 3 has p-type impurity concentration higher than the p-type base region 5. The p-type deep layer 3 is formed from the bottom portion of the p-type base region 5 to a position of the $n^-$-type layer 2 at the predetermined depth from the bottom portion of the p-type base region 5. In the present embodiment, the p-type deep layer 3 is formed of ion implantation of p-type impurities for the $n^-$-type layer 2.

In the cell region RC, the p-type deep layer 3 has a stripe shape in which multiple sections are arranged at equal intervals in one direction, and arranged to be located at the both sides of the trench gate structure. The uppermost side of the p-type deep layer 3, that is, the p-type base region 5 side is located deeper than the trench gate structure, and is arranged apart from the bottom portion of the trench gate structure. The spacing between the adjacent sections of the p-type deep layer 3 is made equal to the width of the trench gate structure, that is, the dimension in a left-right direction of FIG. 2A. Respective boundary lines between the p-type deep layer 3 and the n-type current dispersion layer 4 are arranged at positions corresponding to both ends in the width direction of the bottom of the trench gate structure.

Each of the sections of the p-type deep layer 3 is formed with the same impurity concentration, the same width, and the same depth in an entire region. For example, the p-type impurity concentration is $1.0 \times 10^{17}$ to $1.0 \times 10^{19}/cm^3$, the thickness is about 0.3 to 2 micrometers (μm). The width of each section of the p-type deep layer 3, in other words, the dimension in the left-right direction of FIG. 2A is constant, and the spacing between the adjacent sections of the p-type deep layer 3, in other words, the distance in the left-right direction of FIG. 2A is also constant. For example, the spacing between adjacent sections of the adjacent p-type deep layer 3 is 0.3 to 1.5 μm, and the width of the portion other than the spacing is the width of the p-type deep layer 3. The extending direction of the p-type deep layer 3 may be any direction as long as being a direction identical to the extending direction of the trench gate structure. In this embodiment, the extending direction is the <11-20> direction same as the offset direction. With regard to the description "the p-type deep layer 3 having several sections arranged apart in one direction", the arrangement may be in a direction intersecting the trench gate structure as shown in FIG. 2A. For example, the p-type deep layer 3 illustrated in FIG. 2A may be connected at a portion other than the cross section of FIG. 2A.

The n-type current dispersion layer 4 is arranged below the trench gate structure, and is made of the ion-implanted layer formed in self-alignment with a gate trench 7 described hereinafter. The n-type current dispersion layer 4 may have n-type impurity concentration identical to the $n^-$-type layer 2. However, the n-type current dispersion layer 4 may have higher impurity concentration than the $n^-$-type layer 2. The impurity concentration of the n-type current dispersion layer 4 is, for example, in a range of $1.0 \times 10^{16}$ to $1.0 \times 10^{18}/cm^3$. The n-type impurity concentration of the n-type current dispersion layer 4 may be uniform in the depth direction, or may have a gradient in the profile of the n-type impurity concentration. For example, at a deeper position, in other words, the position at the $n^-$-type layer 2 side of the n-type current dispersion layer 4, the n-type impurity concentration is relatively low; at a shallow position, in other words, the position at the trench gate structure side, the n-type impurity concentration is set to be higher. Thus, the design can be made with emphasis on lowering the channel resistance. For example, at a shallow position, in other words, the position at the $n^-$-type layer 2 side of the n-type current dispersion layer 4, the n-type impurity concentration is relatively low; at a deeper position, in other words, the position at the $n^-$-type layer 2 side, the n-type impurity concentration is set to be higher. Thus, the design can be made with emphasis on lowering the channel resistance at the exit side of the p-type deep layer 3.

The n-type current dispersion layer 4 has a thickness larger than the p-type deep layer 3. The thickness of the n-type current dispersion layer 4 is, for example, in a range of 0.5 to 2.2 μm. The n-type current dispersion layer 4 is formed with the thickness from the bottom portion of the trench gate structure to the bottom portion of the p-type deep layer 3 or a position below the bottom portion of the p-type deep layer 3, in other words, the depth reaching the n⁻-type layer 2. Therefore, the n-type current dispersion layer 4 is coupled to the n⁻-type layer 2 at the bottom portion of the n-type current dispersion layer 4. The spacing between the adjacent sections of the p-type deep layer 3 is the width of the n-type current dispersion layer 4. The center position of the n-type current dispersion layer 4 in the width direction coincides with the center position of the trench gate structure in the width direction.

In the present embodiment, a drift layer includes the n-type current dispersion layer 4 and the n⁻-type layer 2.

The p-type base region 5 is a portion included in the channel region connected between the n⁺-type source region 6 and the n-type current dispersion layer 4 at the time of operating the MOSFET 100, and is arranged to be in contact with the side surface of the trench gate structure at the both side sandwiching the trench gate structure. The p-type base region 5 has, for example, p-type impurity concentration of $2.0\times10^{17}/cm^3$. In the present embodiment, the thickness of the p-type base region 5 is set to the thickness that the p-type base region 5 covers a corner portion of the gate trench. The bottom portion of the p-type base region 5 is set to be at a position deeper than the bottom portion of the trench gate structure. For example, a section of the bottom portion in contact with the side surface of the trench gate structure is set to, for example, 300 nanometers (nm). Therefore, the p-type base region 5 is connected to the n-type current dispersion layer 4 at a portion located below the gate trench 7.

A section of the surface portion of the p-type base region 5 different from the n⁺-type source region 6, in particular, the location sandwiched between the n⁺-type source regions 6 respectively in the adjacent cells in the MOSFET 100 is the p-type contact region 5a with higher concentration of the p-type impurities. In the present embodiment, the p-type contact region 5a is formed up to a position in contact with the p-type deep layer 3. However, only a surface layer portion of the p-type base region 5 may be the p-type contact region 5a.

The n⁺-type source region 6 is higher impurity concentration than the n⁻-type layer 2 and the n-type current dispersion layer 4, and the n-type impurity concentration in the surface layer portion is, for example, $2.5\times10^{18}$ to $1.0\times10^{19}/cm^3$, and the thickness is about 0.5 μm. The n⁺-type source region 6 is arranged at the side surface of the trench gate structure at both sides of the trench gate structure.

The trench gate structure is formed in a linear shape in which a width direction of the trench gate structure is a horizontal direction (left-right direction) of the plane of the drawing of FIG. 2A; a length direction of the trench gate structure is a direction normal to the plane of the drawing of FIG. 2A; and a depth direction of the trench gate structure is a vertical direction (up-down direction) of the drawing of FIG. 2A. Although FIG. 2A only illustrates the trench gate structure in one-cell unit, multiple trench gate structures are arranged in a stripe shape by arranging them at an equal interval. In FIG. 1, the number of trench gate structures is reduced for clarity, but in reality, a large number of similar structures are disposed.

The trench gate structure is formed by embedding the gate insulation film 8 and a gate electrode 9 in the gate trench 7 penetrating the n⁺-type source region 6 and having a depth at a halfway position in the thickness direction of the p-type base region 5.

The gate trench 7 includes a base surface and a side surface. The n-type current dispersion layer 4 is formed at the base surface of the gate trench 7, and the p-type base region 5 and the n⁺-type source region 6 are formed at the side surface of the gate trench 7. The side surfaces of the gate trench 7 are slightly inclined with respect to the SiC surface, but they may be formed perpendicularly. The bottom portion of the gate trench 7 has a flat shape, and a corner portion as the boundary position between the side surface and the base surface of the gate trench 7 is angular. However, the bottom portion and the corner portion of the gate trench 7 may have a rounded shape. When the bottom portion and the corner portion of the gate trench 7 respectively have rounded shapes, it may be preferable that the film thickness of the gate insulation film 8 is made uniform.

The gate insulation film 8 includes, for example, an oxide film, and covers a portion of at least the p-type base region 5 located at the side surface of the gate trench 7, in other words, the inner wall surface of the gate trench 7 including a channel region.

The gate electrode 9 made of doped polycrystalline silicon (Poly-Si) is formed at a surface of the gate insulation film 8 in the gate trench 7. In the present embodiment, in the cell region RC, the gate electrode 9 is arranged only in the gate trench 7; however, the gate electrode 9 may be formed to protrude outside the gate trench 7.

An interlayer insulation film 10 is formed so as to cover the gate electrode 9. Further, a source electrode 11 is formed on an opposite side of the n⁺-type substrate 1 across the n⁻-type layer 2, specifically, over the surfaces of the n⁺-type source region 6 and the p-type contact region 5a. The source electrode 11 corresponds to a first electrode. In a cross section different from FIG. 2A, for example, the gate wiring layer (not shown) is formed at the surface of the gate electrode 9. The source electrode 11 and the gate wire layer are made of multiple metals, for example, Ni/Al. At least a portion of the multiple metals in contact with the n-type SiC, specifically, the n⁺-type source region 6 is made of a metal capable of bringing in ohmic contact with the n-type SiC. In addition, at least a portion of the multiple metals in contact with the p-type SiC, more particularly, a portion in contact with the p-type contact region 5a and a p-type hole extraction layer 31 is made of a metal capable of being in ohmic contact with the p-type SiC.

The source electrode 11 and the gate wire layer are electrically insulated from each other by being separated on the interlayer insulation film 10. The source electrode 11 is electrically brought in electric contact with the n⁺-type source region 6 and the p-type contact region 5a through a contact hole provided in the interlayer insulation film 10, and the gate wire layer is brought in electric contact with the gate electrode 9.

Further, a drain electrode 12 corresponding to a second electrode electrically connected to the n⁺-type substrate 1 is formed on a rear surface of the n⁺-type substrate 1. The structure described above configures a MOSFET 100 with an n-channel type inverted trench gate structure. The MOSFET 100 described above is provided with multiple cells to configure the cell region RC.

As illustrated in FIG. 1, in a guard ring region RG, the p-type guard ring 21 having multiple sections surrounds the cell region RC and the junction region RJ at the surface layer portion of the n⁻-type layer 2. In the present embodiment, each of the sections of the p-type guard ring 21 has a rectangular shape with four rounded corners, but may have another frame shape such as a circular shape. As illustrated in FIG. 2C, the p-type guard ring 21 is formed from the surface of the n$^-$-type layer 2 to a position at the predetermined depth from the surface of the n$^-$-type layer 2. A lower layer portion 21a of the p-type guard ring 21 has a depth identical to the p-type deep layer 3, and has p-type impurity concentration identical to the p-type deep layer 3. An upper layer portion 21b of the p-type guard ring 21 has a depth identical to the p-type contact region 5a, and has p-type impurity concentration identical to the p-type contact region 5a. The p-type guard ring 21 includes an ion-implanted layer formed by ion implantation of the p-type impurities to the n$^-$-type layer 2.

Although not shown, an EQR structure is provided on the outer periphery of the p-type guard ring 21 as necessary, thereby forming the guard ring region RG provided with an outer peripheral withstand voltage structure surrounding the cell region RC.

Further, an area from the cell region RC to the guard ring region RG is defined as the junction region RJ, and in the junction region RJ, a p-type deep layer 30 and a p-type hole extraction layer 31 are formed at the surface layer portion of the n$^-$-type layer 2. By providing the p-type deep layer 30, the rise of the electric field at the junction region RJ is suppressed and the breakdown voltage is enhanced. The p-type deep layer 30 and the p-type deep layer 3 are formed by ion implantation. The p-type deep layer 30 has a depth identical to the p-type deep layer 3, and has p-type impurity concentration identical to the p-type deep layer 3. By providing the p-type hole extraction layer 31, it is possible to extract the holes generated at the peripheral region, in a case where the avalanche breakdown occurs at the cell region RC, or in a case where the avalanche breakdown occurs at the junction region RJ. Therefore, it is possible to restrict the holes from flowing into the cell region RC side, and it is possible to suppress element breakdown. The p-type hole extraction layer 31 and the p-type contact region 5a are formed by ion implantation. The p-type hole extraction layer 31 has a depth identical to the p-type contact region 5a, and has p-type impurity concentration identical to the p-type contact region 5a.

The p-type deep layer 30 and the p-type hole extraction layer 31 are connected to the p-type base region 5. Although the interlayer insulation film 10 is formed also at the surface of the p-type hole extraction layer 31, the cross section of FIG. 2B is a region where the contact holes are formed, and the p-type hole extraction layer 31 is electrically connected to the source electrode 11. The p-type deep layer 30 and the p-type hole extraction layer 31 are connected to a source potential. In the case of the present embodiment, as hatched in FIG. 1, the junction region RJ is formed so as to surround the cell region RC, and the p-type guard ring 21 has multiple sections. Each of the sections of the p-type guard ring 21 has four rounded corners, and is formed so as to surround the outside of the junction region RJ.

The SiC semiconductor device according to the present embodiment is configured by the structure described above. In the SiC semiconductor device configured as described above, when the MOSFET 100 is turned on, a channel region is formed in the surface portion of the p-type base region 5 located on the side surface of the gate trench 7 by controlling the voltage applied to the gate electrode 9. As a result, the n$^+$-type source region 6, a channel region, the n-type current dispersion layer 4 and the n$^-$-type layer 2 are formed as a current path, and a current flows between the source electrode 11 and the drain electrode 12.

In a case of the MOSFET 100 according to the present embodiment, the p-type base region 5 is formed to a position deeper than the trench gate structure, and the p-type base region 5 and the n-type current dispersion layer 4 are connected below the trench gate structure. When a channel region is formed at a portion of the p-type base region 5 in contact with the side surface of the trench gate structure, the channel region is connected to the n-type current dispersion layer 4. Thus it is possible to flow a current between the source electrode 11 and the drain electrode 12 through the n$^-$-type layer 2.

When the MOSFET 100 is turned off, even if a high voltage is applied, the p-type deep layer 3 and the p-type deep layer 30 formed up to a position deeper than that of the trench gate structure inhibit the entry of an electric field into the bottom portions of the gate trenches. For that reason, the electric field concentration at the bottom portions of the trench gate structure is reduced. As a result, breakdown of the gate insulation film 8 is prevented.

Further, in the junction region RJ, the rising of the equipotential lines is inhibited, and the equipotential lines are directed toward the guard ring region RG side. In the guard ring region RG, the equipotential lines are gradually terminated toward the outer peripheral direction by the p-type guard ring 21, and a desired withstand voltage can be obtained also in the guard ring region RG. The withstand voltage may also be referred to as a breakdown voltage.

Figure 3A:
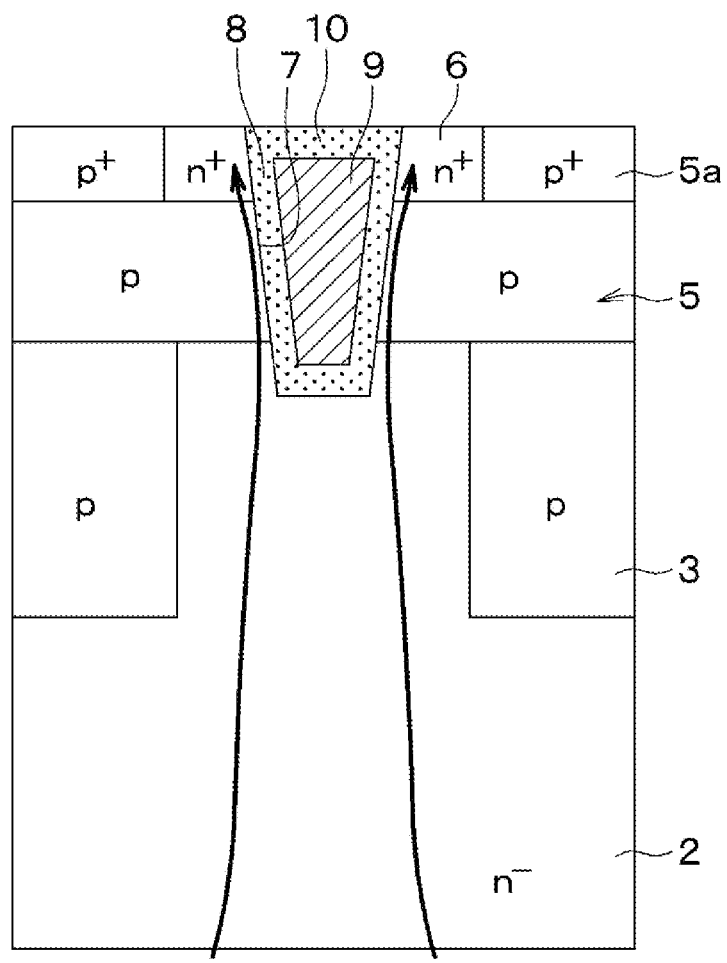
FIG. 3A is a partial cross-sectional view showing, for example, the structure and operation of a MOSFET in a comparative structure.

A MOSFET in a comparative structure is illustrated in FIG. 3A. The p-type deep layer 3 in the comparative structure is formed to have a layout in a stripe shape, and then the p-type base region 5 and the n$^+$-type source region 6 are formed. Subsequently, the trench gate structure is formed. In this case, positional misalignment occurs between the p-type deep layer 3 and the trench gate structure due to mask misalignment. The respective paths of the current flowing along the side surfaces of the gate trench 7 from the n$^-$-type layer 2 are different on the left and right sides of the trench gate structure. Therefore, characteristic variation occurs.

Figure 3B:
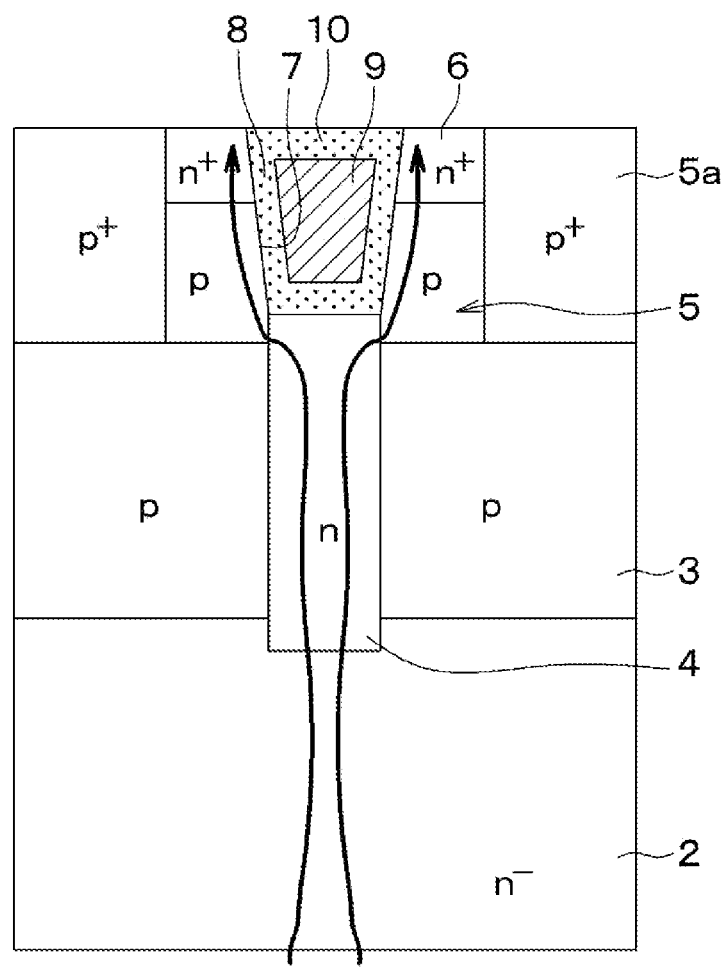
FIG. 3B is a partial cross-sectional view showing, for example, the structure and operation of the MOSFET according to the first embodiment.

In contrast, in the MOSFET according to the present embodiment illustrated in FIG. 3B, the n-type current dispersion layer 4 is formed below the trench gate structure from the bottom portion of the gate trench 7, and the positional misalignment between the trench gate structure and the p-type deep layer 3 does not occur. The respective paths of the current flowing along the side surfaces of each of the n-type current dispersion layer 4 and the gate trench 7 are the same on the left and right sides of the trench gate structure. Therefore, the characteristic variation do not occur mostly. Therefore, it is possible to suppress the occurrence of the characteristic variation.

Next, a process of manufacturing the SiC semiconductor device according to the present embodiment will be described by referring to FIGS. 4A to 4I.

(Process shown in FIG. 4A) First, a semiconductor substrate is prepared by epitaxially growing an n$^-$-type layer 2 made of SiC on the main surface of an n$^+$-type substrate 1. At this time, a semiconductor substrate may be prepared by epitaxially growing the n$^-$-type layer 2 on the main surface of the n$^+$-type substrate 1, or a so-called epitaxial substrate in which the n$^-$-type layer 2 is epitaxially grown on the main surface of the n$^+$-type substrate 1 in advance may be prepared as a semiconductor substrate.

(Process shown in FIG. 4B) Next, a mask 50 is disposed on the n$^-$-type layer 2, and the mask 50 is opened at a region corresponding to a formation prospective region where the p-type deep layer 3, a p-type deep layer 30, and the p-type guard ring 21 are to be formed. Then, p-type impurity ions are implanted by use of the mask 50. At this time, the range of ion implantation is adjusted so that the p-type impurities are implanted to a predetermined depth deeper than the surface of the n⁻-type layer 2. As a result, a p-type layer 101 is formed to form the p-type deep layer 3, the p-type deep layer 30, and a lower layer portion 21a of the p-type guard ring 21. The p-type layer 101 corresponds to a first layer.

Subsequently, the mask 50 which has been used earlier is used again for ion implantation of the p-type impurities. At this time, the range of ion implantation is adjusted so that the p-type impurities are implanted to a predetermined depth from the surface of the n⁻-type layer 2. Thus, a p-type layer 102 is formed to form the p-type base region 5, the p-type hole extraction layer 31 and an upper layer portion 21b of the p-type guard ring 21. Subsequently, the mask 50 is removed. The p-type layer 102 corresponds to a second layer.

In the present embodiment, the p-type layer 101 is formed, and then the p-type layer 102 is formed. However, the forming order may be reversed.

(Process shown in FIG. 4C) Next, a mask 51 is disposed on the p-type layer 102 for forming, for example, the p-type hole extraction layer 31 and the p-type guard ring 21. The mask 51 is opened at a predetermined region corresponding to at least the formation prospective region of the n⁺-type source region 6 in which the n⁺-type source region 6 is to be formed. In the present embodiment, the mask 51 is opened in the cell region RC. Then, n-type impurity ions are implanted by use of the mask 51. As a result, an n⁺-type layer 103 for forming the n⁺-type source region 6 is formed. The n⁺-type layer 103 corresponds to a first conductivity-type layer. Subsequently, the mask 51 is removed. The mask 51 corresponds to a second mask.

(Process shown in FIG. 4D) A mask 52 is disposed on the n⁻-type layer 2 including the n⁺-type layer 103 and the p-type layer 102. Subsequently, a portion of the mask 52 is opened at a region corresponding to a formation prospective region in which the p-type contact region 5a, the p-type hole extraction layer 31, and the upper layer portion 21b of the p-type guard ring 21 are to be formed. The ion implantation of the p-type impurities is conducted by using the mask 52, and a p-type layer 104 is formed. The p-type layer 104 has higher impurity concentration than the p-type layer 102, and corresponds to a second conductivity-type layer. The p-type contact region 5a, the p-type hole extraction layer 31 and the upper layer portion 21b of the p-type guard ring 21 are formed by the p-type layer 104. Thereafter, the mask 52 is removed.

(Process shown in FIG. 4E) After a mask 53 is formed on the n⁻-type layer 2 including, for example, the n⁺-type source region 6 and the p-type hole extraction layer 31, a portion of the mask 53 corresponding to a formation prospective region in which the gate trench 7 is to be formed is opened. By using the mask 53, the gate trench 7 with the depth to the halfway of the p-type base region 5 in the thickness direction is formed by conducting anisotropic etching such as reactive ion etching (RIE). The mask 53 corresponds to a first mask.

(Process shown in FIG. 4F) The mask used for forming the gate trench 7 is again used to conduct ion implantation of the n-type impurities. Therefore, the n-type current dispersion layer 4 is formed at the bottom portion of the gate trench 7. Since the gate trench 7 has the depth to the halfway of the p-type base region 5 in the thickness direction, the n-type current dispersion layer 4 can be connected to a portion of the p-type base region 5 where the channel region is formed.

As for the ion implantation at this time, the direction of ion implantation can be made perpendicular to the mask surface, but it is also possible to conduct oblique ion implantation that is tilted to a direction normal to the mask surface. Although ions may also be implanted at the side surface of the gate trench 7, it is possible to remove an ion implantation portion formed at the side surface of the gate trench 7, as long as the side surface of the gate trench 7 is etched after the ion implantation; and the sacrificial oxidation and etching are conducted.

Although the ion implantation for forming the n-type current dispersion layer 4 is conducted after the formation of the gate trench 7 in the present embodiment, it may also be conducted before the formation of the gate trench 7. In other words, the ion implantation for forming the n-type current dispersion layer 4 is conducted in advance by using a mask for forming the gate trench 7, and then the gate trench 7 may be formed by using the mask. However, in this case, since the range of the ion implantation for forming the n-type current dispersion layer 4 becomes larger, relatively high ion implantation energy is required.

(Process shown in FIG. 4G) After removing the mask, for example, the deposition of an oxide film is conducted to form the gate insulation film 8, and the gate insulation film 8 covers the inner wall surface of the gate trench 7 and the surface of the n⁺-type source region 6. Then, a Poly-Si doped with a p-type impurity or an n-type impurity is deposited, and then etched back to leave at least the Poly-Si in the gate trench 7, thereby forming the gate electrode 9. As a result, the trench gate structure is formed.

(Process shown in FIG. 4H) The interlayer insulation film 10 made of, for example, an oxide film is formed so as to cover the respective surfaces of the gate electrode 9 and the gate insulation film 8. After a mask (not shown) has been formed on a surface of the interlayer insulation film 10, the mask is opened at a portion of the mask located the cell region RC and the mask is also opened at portions corresponding to at least the p-type contact region 5a and the n⁺-type source region 6 and the vicinity of at least the p-type contact region 5a and the n⁺-type source region 6. At the same time, the mask is opened also at a portion corresponding to the p-type hole extraction layer 31. Thereafter, the interlayer insulation film 10 is patterned by use of the mask to form a contact hole exposing the p-type contact region 5a and the n⁺-type source region 6 and a contact hole for exposing the p-type extraction layer 31. In the present embodiment, the upper surface of the interlayer insulation film 10 is flush with the SiC surface of, for example, the n⁺-type source region 6, the interlayer insulation film 10 may be left on the SiC surface.

(Process shown in FIG. 4I) An electrode material having, for example, a multilayer structure of multiple metals is formed on the surface of the interlayer insulation film 10. The source electrode 11, a gate wire (not shown), and the like are formed by patterning the electrode material.

The SiC semiconductor device according to the present embodiment is completed by performing a process of forming the drain electrode 12 on the rear surface of the n⁺-type substrate 1, although the subsequent process is not illustrated.

As described above, in the present embodiment, the mask used at the formation of the gate trench 7 for forming the trench gate structure is still adopted to form the n-type current dispersion layer 4 by conducting the ion implantation of the n-type impurities. As a result, since the n-type current dispersion layer 4 can be formed in a self-aligned manner with respect to the trench gate structure, it is possible to mostly eliminate the misalignment between the p-type deep layer 3 and the trench gate structure, and it is possible to suppress the characteristic variation. Since it is no longer necessary to design margins in consideration of misalignment of the n-type current dispersion layer 4, it is possible to shorten the cell pitch, in other words, the spacing between the cells to attain the miniaturization of the element.

Since the mask at the formation of the gate trench 7 is adopted as a mask for forming the n-type current dispersion layer 4, it is possible to simplify the manufacturing process, and it is possible to reduce the manufacturing cost.

Similarly, the identical mask 50 is used as the mask at the formation of the p-type deep layer 3, the p-type deep layer 30 and the lower layer portion 21a of the p-type guard ring 21 and the mask at the formation of, for example, the p-type base region 5. Therefore, the number of masks can be reduced as compared with the case where separate masks are prepared. Therefore, the manufacturing process can be further simplified, and the manufacturing cost can be reduced.

(Second Embodiment) The following describes a second embodiment. The present embodiment is different from the first embodiment in a method of manufacturing a semiconductor device, and the other parts are similar to those of the first embodiment. Therefore, only a part different from the first embodiment will be described below.

In the present embodiment, for example, the p-type deep layer 3, the p-type deep layer 30, the lower layer portion 21a of the p-type guard ring 21, and the p-type base region 5 are formed by a method other than ion implantation with a mask. Next, a process of manufacturing the semiconductor device according to the present embodiment will be described by referring to FIGS. 5A to 5E.

(Process in FIG. 5A) First, as in the process shown in FIG. 3A described in the first embodiment, a semiconductor substrate obtained by epitaxially growing the n⁻-type layer 2 on a main surface of the n⁺-type substrate 1 is prepared as a semiconductor substrate. Then, the p-type layer 101 and the p-type layer 102 respectively having different impurity concentrations are sequentially formed on the n⁻-type layer 2. For example, the p-type layer 101 and the p-type layer 102 respectively having different impurity concentrations are sequentially formed at the surface of the n⁻-type layer 2 by conducting the ion implantation of the p-type impurities without a mask while changing the range of the ion implantation and the dose amount. In other words, the ion implantation of the p-type impurities are conducted without arranging a mask on the n⁻-type layer 2. Therefore, it is possible to eliminate a mask formation process at the time of implanting the p-type impurities and simplify the manufacturing process.

Additionally, the p-type layer 101 and the p-type layer 102 respectively having different impurity concentrations can be epitaxially grown sequentially at the surface of the n⁻-type layer 2. Since the impurity concentration of the epitaxial film can be changed by changing the concentration of dopant gas during the epitaxial growth, the respective concentrations of the p-type layer 101 and the p-type layer 102 can be properly set by adjusting the concentration of the dopant gas.

(Process in FIG. 5B) Next, the n⁺-type layer 103 is formed on the p-type layer 102. The n⁺-type layer 103 is adopted for forming the n⁺-type source region 6. For example, the n⁺-type layer 103 can also be formed by conducting the ion implantation of the n-type impurities at the surface layer portion of the p-type layer 102. Also at this time, if the ion implantation is conducted without a mask, it is possible to eliminate the mask formation process at the time of implanting the n-type impurities and simplify the manufacturing process. The n⁺-type layer 103 may be formed at the surface of the p-type layer 102 by epitaxial growth.

The ion implantation may be conducted with a mask having an opening on the p-type layer 102 at a position corresponding to the formation prospective position of the n⁺-type source region 6 where the n⁺-type source region 6 is to be formed.

(Process in FIG. 5C) A mask 60 covers the formation prospective position of the n⁺-type source region 6. After the mask 60 is arranged on the n⁺-type layer 103, the ion implantation of the p-type impurities is conducted, and the p-type layer 104 is formed by sending back the n-type portion. The p-type layer 104 is a portion for forming, for example, the p-type contact region 5a, and has higher concentration than the p-type layer 102 and is connected to the p-type layer 102. The p-type layer 104 may be formed to have the same thickness as the n⁺-type layer 103, or may be formed to be thicker than the n⁺-type layer 103. Thereafter, the mask 60 is removed. The present embodiment describes that the p-type layer 104 is formed by conducting the ion implantation with the mask 60; and the n⁺-type layer 103 is formed by conducting the ion implantation without a mask. However, it is also possible that the p-type layer 104 is formed by ion implantation without a mask and the n⁺-type layer 103 is formed by ion implantation with a mask.

(Process in FIG. 5D) After a mask 61 is formed on the n⁺-type source region 6 and the p-type layer 104, a portion of the mask 61 corresponding to the formation prospective region of the gate trench 7 and a region between adjacent sections of the p-type guard ring 21 is opened. In other words, multiple openings respectively having frame shapes are concentrically formed for the mask 61. By using the mask 61, the gate trench 7 with the depth to the halfway of the p-type base region 5 in the thickness direction of the p-type layer 102 is formed by conducting anisotropic etching such as RIE. The p-type layer 102 is adopted for forming the p-type base region 5. A separation trench 105 is formed between adjacent sections of the p-type guard ring 21. The mask 61 corresponds to the first mask.

(Process in FIG. 5E) The mask used for forming the gate trench 7 and the separation trench 105 is again used to conduct ion implantation of the n-type impurities. Therefore, the n-type current dispersion layer 4 is formed at the bottom portion of the gate trench 7. Since the gate trench 7 has the depth to the halfway of the p-type base region 5 in the thickness direction, the n-type current dispersion layer 4 can be connected to a portion of the p-type base region 5 where the channel region is formed.

At the same time, an n-type separation layer 106 is formed at the bottom portion of the separation trench 105. In the outer peripheral region RO, the upper position of the p-type layer 104 and the upper position of the p-type layer 102 are separated by the separation trench 105; and the lower position of the p-type layer 102 and the p-type layer 101 are isolated by the n-type separation layer 106. Therefore, the p-type guard ring 21 is formed.

In other words, the p-type deep layer 3, the p-type deep layer 30 and the lower layer portion 21a of the p-type guard ring 21 are formed by the p-type layer 101, and the p-type base region 5 is formed by the p-type layer 102. The upper layer portion 21b of the p-type guard ring 21 is formed by the p-type layer 102 and the p-type layer 104, and the p-type contact region 5a and the p-type hole extraction layer 31 are formed by the p-type layer 104.

Subsequently, as similar to the first embodiment, the trench gate structure is formed by conducting a formation process of the gate insulation film 8 and a formation process of the gate electrode 9. It is possible to manufacture the SiC semiconductor device according to the present embodiment by conducting, for example, a formation process of the interlayer insulation film 10, a formation process of the source electrode 11, and a formation process of the drain electrode 12.

In the manufacturing method according to the present embodiment, for example, the p-type deep layer 3, the p-type deep layer 30, the lower layer portion 21a of the p-type guard ring 21, and the p-type base region 5 are formed by a method other than ion implantation with a mask. In particular, the p-type deep layer 3, the p-type deep layer 30, the lower layer portion 21a of the p-type guard ring 21, and the p-type base region 5 may be formed by the ion implantation without a mask or epitaxial growth. Therefore, a mask adopted for forming the p-type layer 101 and the p-type layer 102 in the first embodiment is not required. Therefore, it is possible to simplify the manufacturing process.

At the time of forming the n$^+$-type layer 103, the ion implantation without a mask is conducted. The n$^+$-type layer 103 is adopted for forming the n$^+$-type source region 6. Therefore, it is possible to eliminate a mask formation process at the time of implanting the n-type impurities and simplify the manufacturing process.

Since the separation trench 105 is formed at the time of forming the gate trench 7; and the n-type separation layer 106 is formed at the time of forming the n-type current dispersion layer 4, the p-type guard ring 21 can be formed without additional process.

(Third embodiment) The following describes a third embodiment. The present embodiment differs from the first and second embodiments in the structure of the n-type current dispersion layer 4, and the other parts are similar to those of the first and second embodiments. Therefore, only a part different from the first and second embodiments will be described below.

Figure 6:
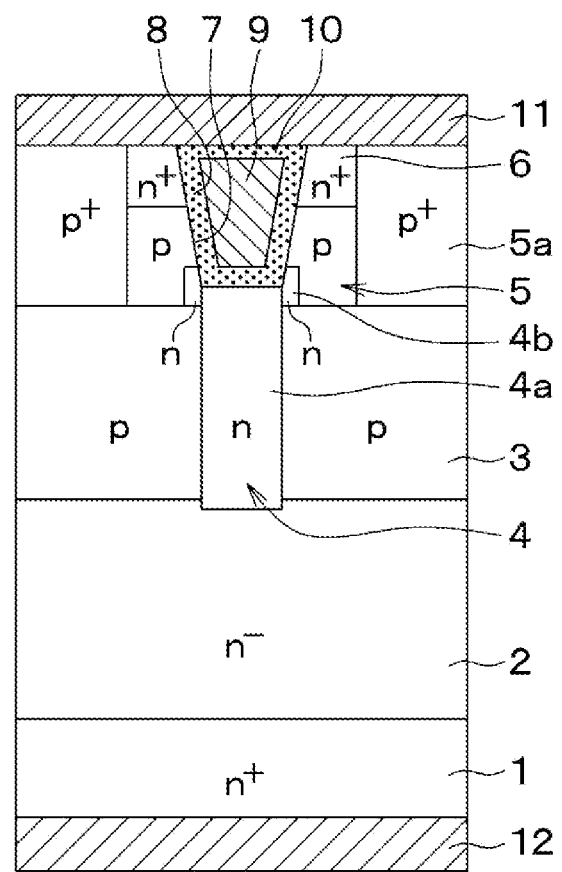
FIG. 6 is a cross-sectional view of a vertical MOSFET included in a SiC semiconductor device according to a third embodiment.

As shown in FIG. 6, in the present embodiment, the n-type current dispersion layer 4 is formed to cover each of a bottom portion and a corner portion of the trench gate structure. In particular, the n-type current dispersion layer 4 has a structure including a lower bottom portion 4a and a wide portion 4b. The lower bottom portion 4a is located at the bottom portion of the gate trench 7, and the wide portion 4b has a width larger than the lower bottom portion 4a. The lower bottom portion 4a has a width substantially identical to the bottom portion of the gate trench 7. The wide portion 4b has a width larger than the bottom portion of the gate trench 7.

The wide portion 4b is formed to cover the corner portion of the gate trench 7. The thickness of the wide portion 4b is arbitrary. In other words, the thickness of the wide portion 4b is arbitrary, as long as the upper surface of the wide portion 4b is at a position shallower than the bottom portion of the gate trench 7; and the lower surface of the wide portion 4b is at a position deeper than the bottom portion of the gate trench 7. The n-type impurity concentration of the wide portion 4b is also arbitrary. As described hereinafter, the wide portion 4b and the lower bottom portion 4a are formed by the ion implantation. The ion implantation may be conducted also at the upper layer portion of the lower bottom portion 4a at the time of forming the wide portion 4b.

Therefore, the n-type impurity concentration of the upper layer portion included in the lower bottom portion 4a is larger than the n-type impurity concentration of each of the wide portion 4b and the lower layer portion included in the lower bottom portion 4a. If the wide portion 4b is made to have n-type impurity concentration higher than a portion of the n-type current dispersion layer 4 below the wide portion 4b, the lowering of the on-resistance can be achieved.

The n-type current dispersion layer 4 is formed by using a mask at the time of forming the gate trench 7. However, if the n-type current dispersion layer 4 is formed only at the bottom portion of the gate trench 7, a channel is hardly formed at the corner portion of the gate trench 7. If the corner portion of the gate trench 7 is covered with the n-type current dispersion layer 4 by forming the wide portion 4b, the corner portion can be used as a current path. Therefore, the current can be conducted effectively if a channel is formed only at the side surface of the gate trench 7. With such a structure, it is possible to further reduce the on-resistance.

The method for manufacturing the SiC is generally identical to the respective methods described in the first and second embodiments in addition to, for example, an ion implantation process for forming the wide portion 4b.

Figure 7A:
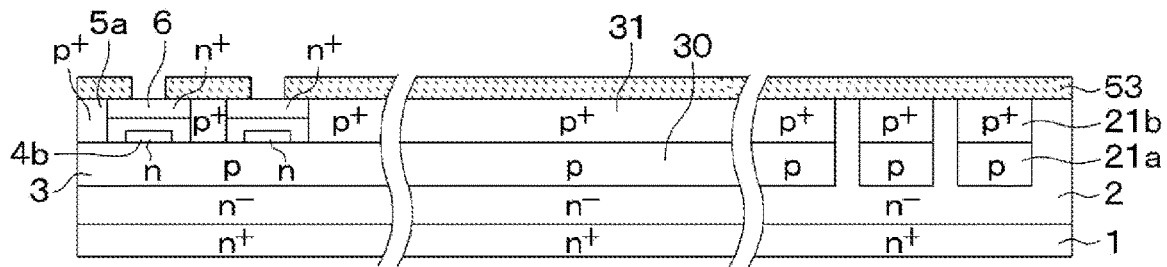
FIG. 7A is a cross-sectional view showing a manufacturing process of the SiC semiconductor device illustrated in FIG. 6 according to the third embodiment.

For example, as illustrated in FIG. 7A, the wide portion 4b is formed by conducting the ion implantation of the n-type impurities before the formation of the gate trench 7, by adopting the mask 53 used for forming the gate trench 7. The wide portion 4b can be formed without being affected by the shape of the gate trench 7. A relatively high energy is required when the range of the ion implantation increases. It is possible to limit an increase in the energy of ion implantation, since only the wide portion 4b of the n-type current dispersion layer but not the entire region of the n-type current dispersion layer 4 is formed before the formation of the gate trench 7. At this time, in order to enlarge the width of the wide portion 4b, it is also possible to conduct oblique ion implantation in which the direction of the ion implantation is tilted to a direction normal to the mask surface.

Figure 4A:
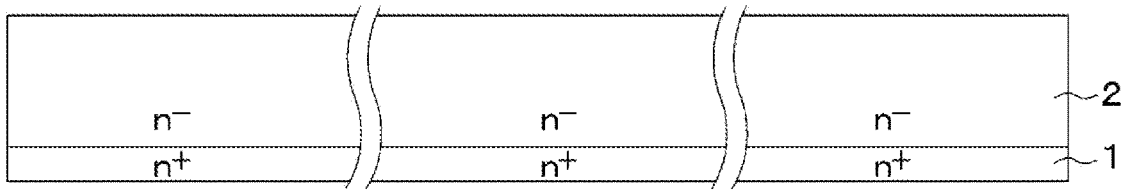
FIG. 4A is a cross-sectional view showing a manufacturing process of the SiC semiconductor device according to a first embodiment, in a cross-sectional view taken along a line IV-IV in FIG. 1.
Figure 4B:
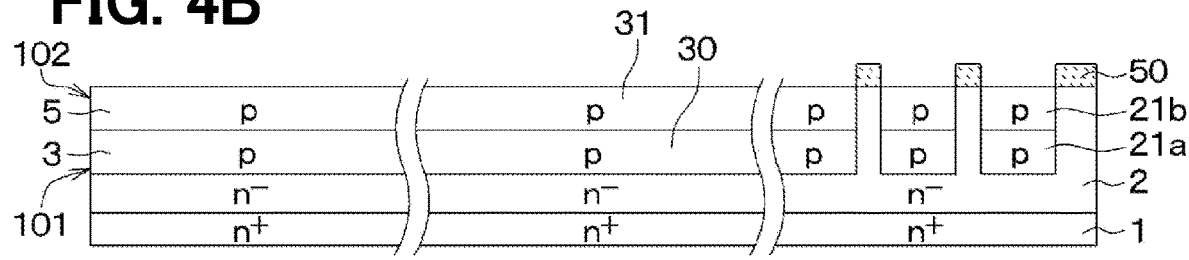
FIG. 4B is a cross-sectional view showing a manufacturing process of the SiC semiconductor device continued from FIG. 4A.
Figure 4C:
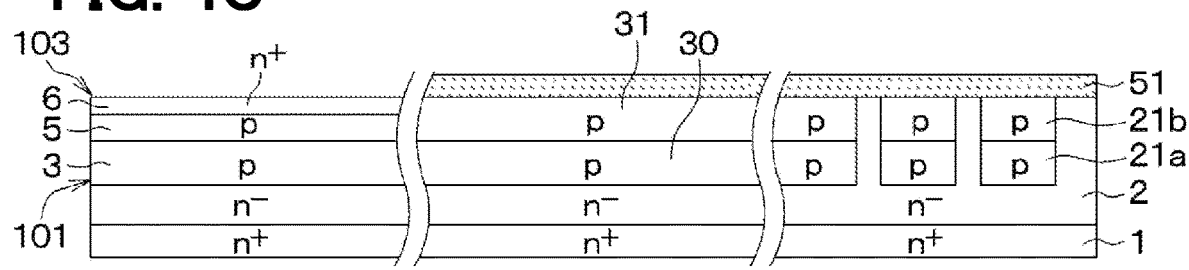
FIG. 4C is a cross-sectional view showing a manufacturing process of the SiC semiconductor device continued from FIG. 4B.
Figure 4D:
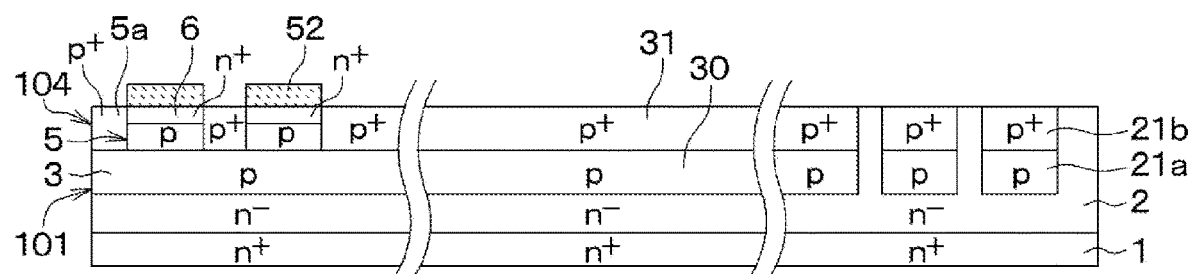
FIG. 4D is a cross-sectional view showing a manufacturing process of the SiC semiconductor device continued from FIG. 4C.
Figure 4E:
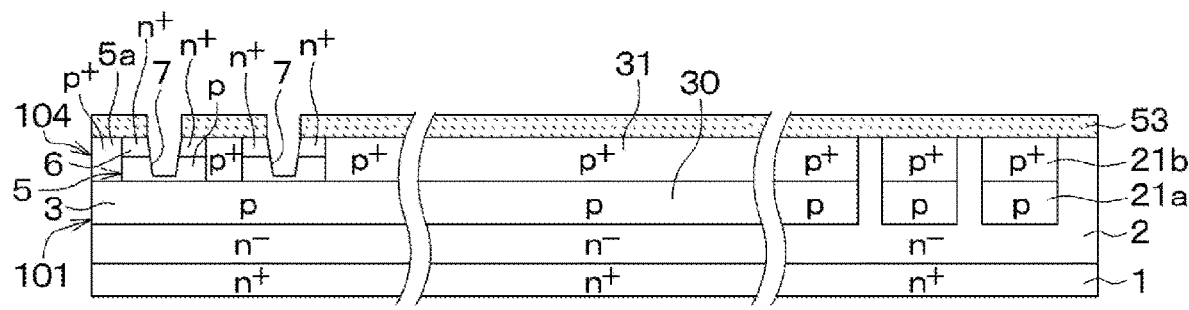
FIG. 4E is a cross-sectional view showing a manufacturing process of the SiC semiconductor device continued from FIG. 4D.
Figure 4F:
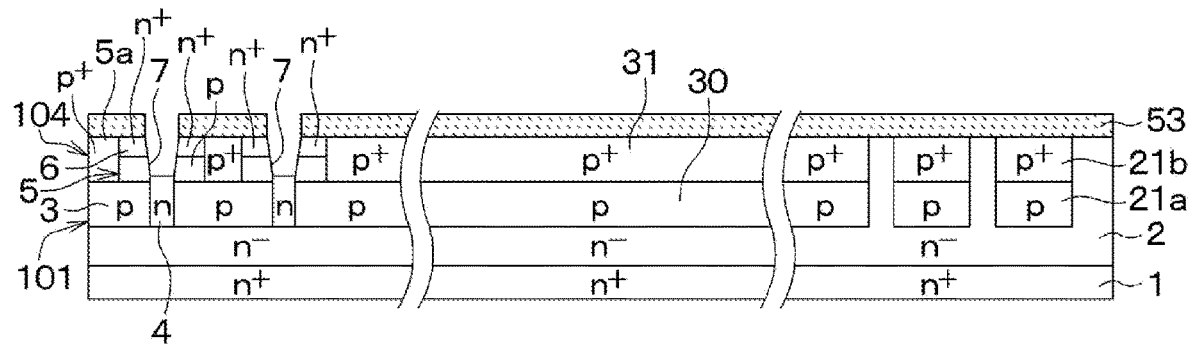
FIG. 4F is a cross-sectional view showing a manufacturing process of the SiC semiconductor device continued from FIG. 4E.
Figure 4G:
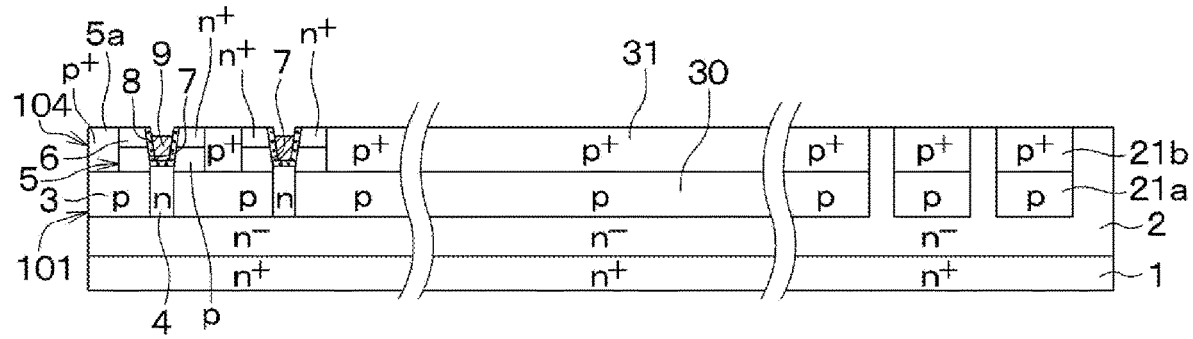
FIG. 4G is a cross-sectional view showing a manufacturing process of the SiC semiconductor device continued from FIG. 4F.
Figure 4H:
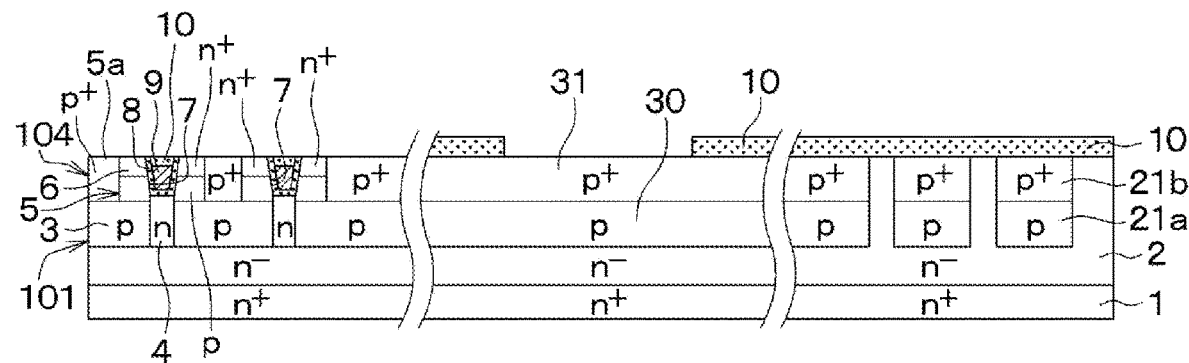
FIG. 4H is a cross-sectional view showing a manufacturing process of the SiC semiconductor device continued from FIG. 4G.
Figure 4I:
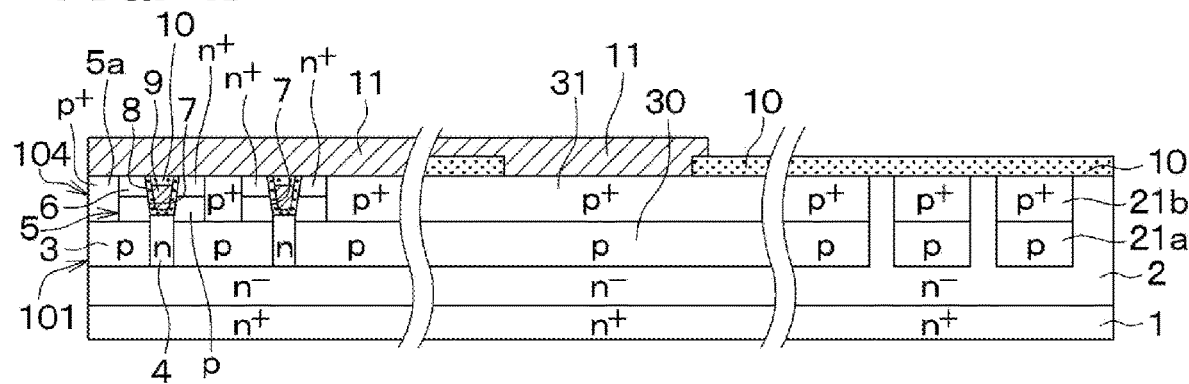
FIG. 4I is a cross-sectional view showing a manufacturing process of the SiC semiconductor device continued from FIG. 4H.
Figure 5A:
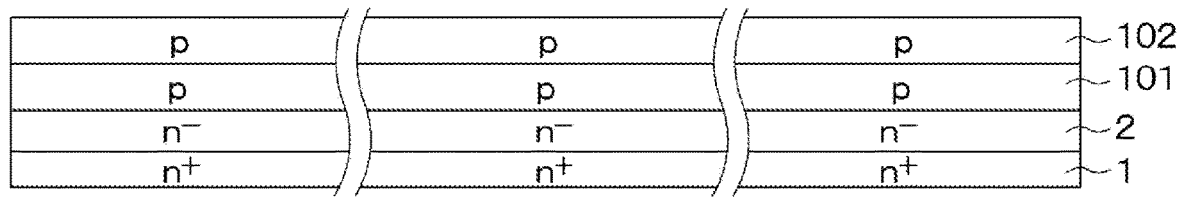
FIG. 5A is a cross-sectional view showing a manufacturing process of a SiC semiconductor device according to a second embodiment.
Figure 5B:
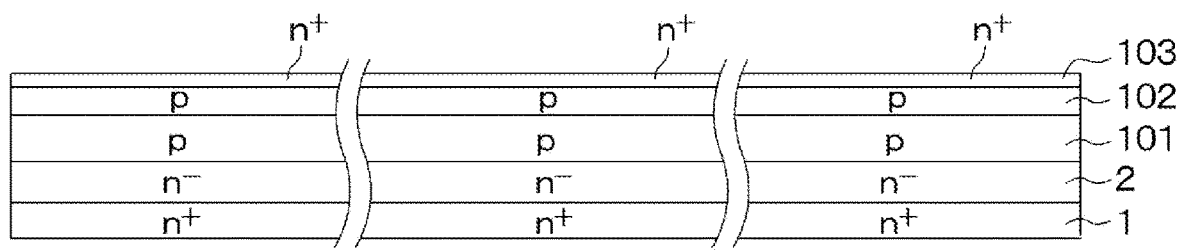
FIG. 5B is a cross-sectional view showing a manufacturing process of the SiC semiconductor device continued from FIG. 5A.
Figure 5C:
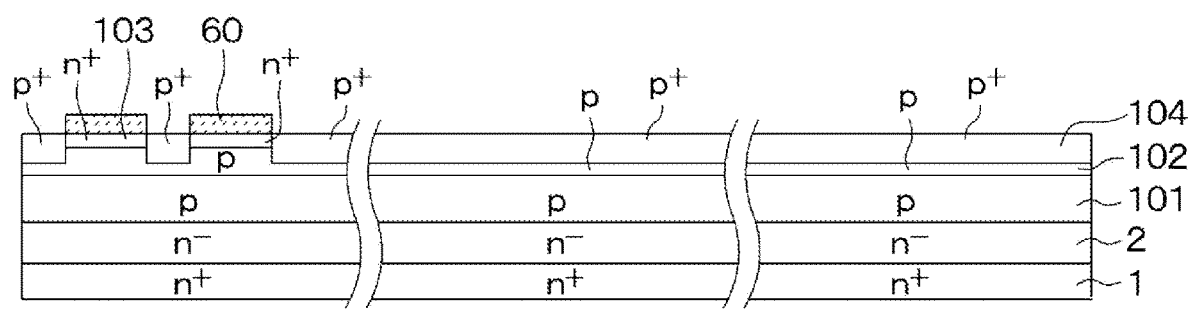
FIG. 5C is a cross-sectional view showing a manufacturing process of the SiC semiconductor device continued from FIG. 5B.
Figure 5D:
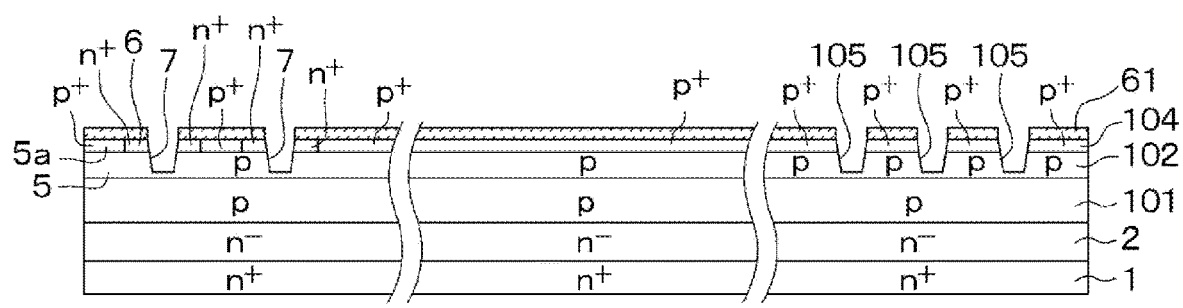
FIG. 5D is a cross-sectional view showing a manufacturing process of the SiC semiconductor device continued from FIG. 5C.
Figure 5E:
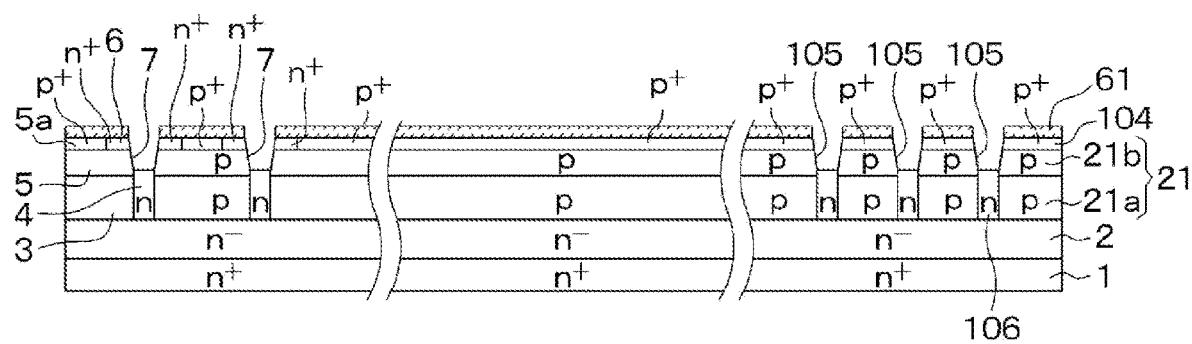
FIG. 5E is a cross-sectional view showing a manufacturing process of the SiC semiconductor device continued from FIG. 5D.
Figure 7B:
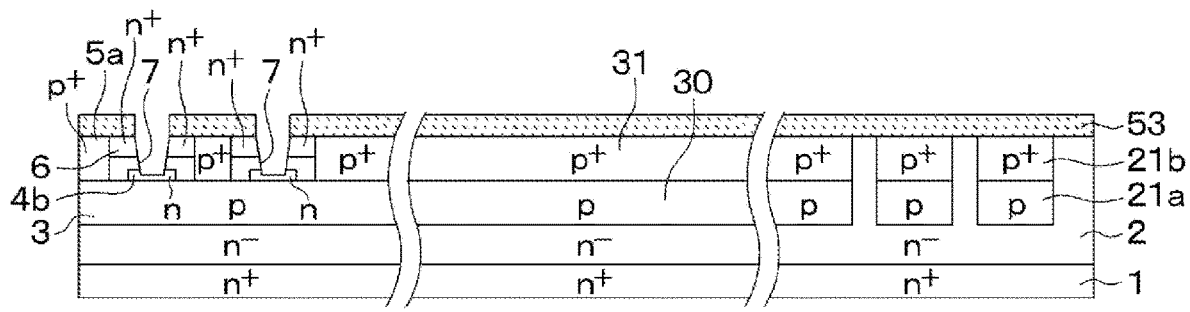
FIG. 7B is a cross-sectional view showing a manufacturing process of the SiC semiconductor device continued from FIG. 7A.
Figure 7C:
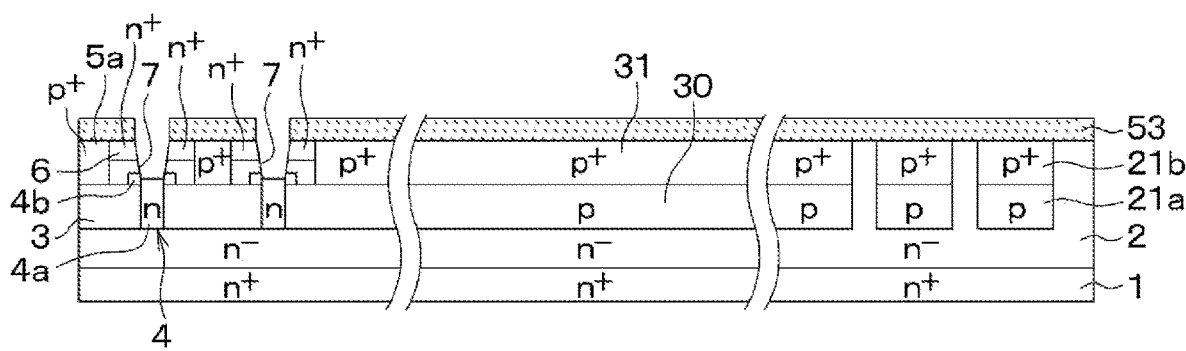
FIG. 7C is a cross-sectional view showing a manufacturing process of the SiC semiconductor device continued from FIG. 7B.

Subsequently, as respective processes illustrated in FIGS. 7B and 7C, the gate trench 7 is formed and the lower bottom portion 4a of the n-type current dispersion layer 4 is formed by conducting the processes identical to FIGS. 4E and 4F. Accordingly, the SiC semiconductor device according to the present embodiment can be manufactured.

(Other Embodiments) While the present disclosure has been described in accordance with the embodiments described above, the present disclosure is not limited to the embodiments and includes various modifications and equivalent modifications. In addition, various combinations and configurations, as well as other combinations and configurations that include only one element, more, or less, are within the scope and spirit of the present disclosure.

For example, in the above embodiment, the bottom portion of the gate trench 7 is located in halfway of the p-type base region 5 in the thickness direction. Since a channel may be formed to connect the n$^+$-type source region 6 and the n-type current dispersion layer 4, the bottom portion of the gate trench 7 may be at a position deeper than the p-type base region 5.

In each of the embodiments described above, the spacing between any adjacent sections of the p-type guard ring 21 may be kept constant, or the width of the section of the p-type guard ring 21 may be wider toward the outer periphery. The p-type guard ring 21 may include at least one of the lower layer portion 21a and the upper layer portion 21b. The lower layer portion 21a formed at a predetermined depth from the surface of the n⁻-type layer 2. The upper layer portion 21b is formed to be in contact with the surface of the n⁻-type layer 2. In a case where the p-type guard ring 21 only includes the lower layer portion 21a, the conductivity type at the surface side of the outer peripheral region RO is turned to the n-type. However, a high breakdown voltage can be attained.

Each of the above embodiments describes that the n⁻-type layer 2 is formed on the n⁺-type substrate 1. The n⁺-type substrate 1 corresponds to a first semiconductor layer, and the n⁻-type layer 2 corresponds to a second semiconductor layer. However, the second semiconductor layer may be formed at the semiconductor substrate, and the first semiconductor layer may be formed by conducting the ion implantation of the impurities at the rear surface side of the second semiconductor layer.

In each of the above embodiments, the p-type deep layer 3 is formed at the surface of the n⁻-type layer 2, and the n-type current dispersion layer 4 is formed to reach the n⁻-type layer 2. The n⁻-type layer 2 corresponds to the second semiconductor layer. However, the above description is merely an example, and other parts may also be included. For example, multiple n-type layers and multiple p-type layers are alternately arranged on the n⁻-type layer 2 to provide a saturation current suppression layer arranged in a stripe shape, and the p-type deep layer 3 and the n-type current dispersion layer 4 may be provided on the saturation current suppression layer.

Each of the above embodiments describes structural examples such as a junction region RJ and the outer peripheral region RO in addition to the cell region RC. However, the above description is merely an example. In other words, if the n-type current dispersion layer is formed at the bottom portion of the trench gate structure for the structure of the cell region RC, the structure of the junction region RJ and the structure of the outer peripheral region RO may be arbitrary. For example, in the first embodiment, the outer peripheral region RO may be recessed to form a mesa structure in which the cell region RC and the junction region RJ respectively protrude beyond the outer peripheral region RO.

For example, in the above embodiment, the n-channel MOSFET 100 in which the first conductivity type is n-type and the second conductivity type is p-type has been described as a semiconductor element included in the cell region RC of the SiC semiconductor device. However, the above description is merely an example, a p-channel MOSFET 100 in which the conductivity type of each component is inverted may also be adopted. An insulated gate bipolar transistor (IGBT) may be adopted instead of the MOSFET 100. The IGBT only changes the conductivity type of the n⁻-type substrate 1 from the n-type to the p-type in each of the embodiments described above, and the structure and manufacturing method of the IGBT are the same as in each of the embodiments described above.

In the embodiments described above, the case in which SiC is used as the semiconductor material has been described, but the present disclosure can also be applied to a semiconductor device using other semiconductor materials such as silicon (Si).

In the case of indicating the crystal orientation, a bar (−) should be added over a desired number properly. Since there is restriction on expression based on electronic filing, in the present specification, a bar is attached before a desired number.

The present disclosure may also be applied to a semiconductor device adopting a wide band gap semiconductor such as silicon carbide (SiC) and a manufacturing method for such a semiconductor device.

What is claimed is:

1. A semiconductor device comprising:
a vertical semiconductor element located in a cell region of the semiconductor device,
wherein the vertical semiconductor element includes:
a first semiconductor layer being a first conductivity type or a second conductivity type;
a second semiconductor layer being the first conductivity type, the second semiconductor layer located on the first semiconductor layer;
a deep layer being the second conductivity type, the deep layer located on the second semiconductor layer and having a plurality of sections being apart to each other in one direction in the cell region;
a current dispersion layer being the first conductivity type, the current dispersion layer located between adjacent two of the plurality of sections of the deep layer on the semiconductor layer in the cell region;
a base region being the second conductivity type, the base region located on and being in contact with the deep layer, the base region partially having a contact region having higher impurity concentration than another region of the base region different from the contact region, the contact region located in at least a surface portion of the base region;
a high-concentration region being the first conductivity type, the high-concentration region located on a portion of the base region different from the contact region, the high-concentration region having higher impurity concentration than the second semiconductor layer;
a trench gate structure having
a gate trench extending from a surface of the high-concentration region and reaching the base region,
a gate insulation film covering an inner wall surface of the gate trench, and
a gate electrode located on the gate insulation film,
an interlayer insulation film covering the gate electrode and the gate insulation film, the interlayer insulation film having a contact hole;
a first electrode electrically connected to the high-concentration region and the contact region through the contact hole; and
a second electrode located at the first semiconductor layer on a side opposite from the second semiconductor layer, and
wherein the current dispersion layer is located below the trench gate structure, and includes an ion-implanted layer extending from a bottom portion of the gate trench to a bottom portion of the deep layer or a location below the bottom portion of the deep layer.

2. The semiconductor device according to claim 1, wherein the current dispersion layer reaches the second semiconductor layer.

3. The semiconductor device according to claim 1, wherein the base region extends to a location to cover a corner portion of the gate trench, and the base region is connected to the current dispersion layer at a portion of the base region located at the bottom portion of the gate trench.

4. The semiconductor device according to claim 1, wherein the gate trench has a corner portion as a boundary location between the bottom portion of the gate trench and a lower portion of the gate trench, and wherein the current dispersion layer includes a wide portion at the bottom portion of the gate trench to cover the corner portion of the gate trench, and the wide portion has a larger width than the bottom portion of the gate trench.

5. The semiconductor device according to claim 1, wherein the vertical semiconductor element is configured such that a channel is formed at a region including at least a portion of the base region located at a side surface of the gate trench, and the channel and the current dispersion layer are connected to allow a current flowing between the first electrode and the second electrode in response to a gate voltage applied to the gate electrode.

6. The semiconductor device according to claim 1, wherein a gradient exists in a profile of impurity concentration of the current dispersion layer, such that the impurity concentration of the current dispersion layer varies from a location closer to the second semiconductor layer to a location closer to the trench gate structure.

7. The semiconductor device according to claim 1, further comprising:
a guard ring being the second conductivity type and located in an outer peripheral region of the semiconductor device surrounding the cell region, the guard ring being in contact with a surface of the second semiconductor layer at a surface layer portion of the second semiconductor layer or located at a position at a predetermined depth from the surface of the second semiconductor layer, the guard ring having a concentric frame shape concentrically around the cell region.

\* \* \* \* \*